United States Patent [19]

Szydlo et al.

[11] Patent Number: 4,704,784

[45] Date of Patent: Nov. 10, 1987

[54] METHOD OF MAKING THIN FILM FIELD EFFECT TRANSISTORS FOR A LIQUID CRYSTAL DISPLAY DEVICE

[75] Inventors: Nicolas Szydlo, Limours; Francois Boulitrop, Sceaux; Rolande Kasprzak, Gif sur Yvette, all of France

[73] Assignee: Thomson-CSF, Paris, France

[21] Appl. No.: 746,316

[22] Filed: Jun. 19, 1985

[30] Foreign Application Priority Data

Jun. 22, 1984 [FR] France ............................. 84 09875

[51] Int. Cl.[4] .................................... H01L 21/425
[52] U.S. Cl. .............................. 437/41; 148/DIG. 77;
148/DIG. 150; 156/643; 156/649; 357/23.7;
357/47; 357/56; 437/101; 437/235
[58] Field of Search ............... 29/571, 576 B, 576 W,
29/578, 580, 591; 148/1.5, DIG. 77, DIG. 150;
156/643, 649; 357/23.7, 47, 56; 427/93

[56] References Cited

U.S. PATENT DOCUMENTS

| 3,740,280 | 6/1973 | Ronen | 156/11 |
| 3,890,632 | 6/1975 | Ham et al. | 357/23.7 |
| 4,054,895 | 10/1977 | Ham | 357/23.7 |
| 4,242,156 | 12/1980 | Peel | 148/175 |
| 4,263,709 | 4/1981 | Weitzel et al. | 29/571 |
| 4,422,090 | 12/1983 | Shepherd et al. | 357/23 |
| 4,596,071 | 6/1986 | Kita | 29/571 |

FOREIGN PATENT DOCUMENTS 0076587 4/1983 European Pat. Off. .
0097533 1/1984 European Pat. Off. .

OTHER PUBLICATIONS

Ast, "Materials Limitations of Amorphous-Si:H Transistors", IEEE Transactions on Electron Devices, vol. ED-30, #5, May 1985.
Ghondi, VLSI Fabrication Principles, John Wiley & Sons, New York, 1983, pp. 346–348.
IEEE Transactions on Electron Devices, vol. ED-30, No. 5, May 1983, pp. 532–539, IEEE, New York, U.S. D.G. AST: "Materials Limitations of Amorphous-Si:H Transistors".

Primary Examiner—George T. Ozaki
Attorney, Agent, or Firm—Oblon, Fisher, Spivak, McClelland & Maier

[57] ABSTRACT

The invention relates to a method for the manufacture of field effect transistors of the coplanar and self-aligned type, obtained in thin film form on an insulating substrate.

As a result of electrode self-alignment and ion implantation, the method makes it possible to use only three masking levels.

The invention is applicable to the field of large surface microelectronics and particularly to the control and addressing of a flat liquid crystal screen or an image sensor.

14 Claims, 16 Drawing Figures

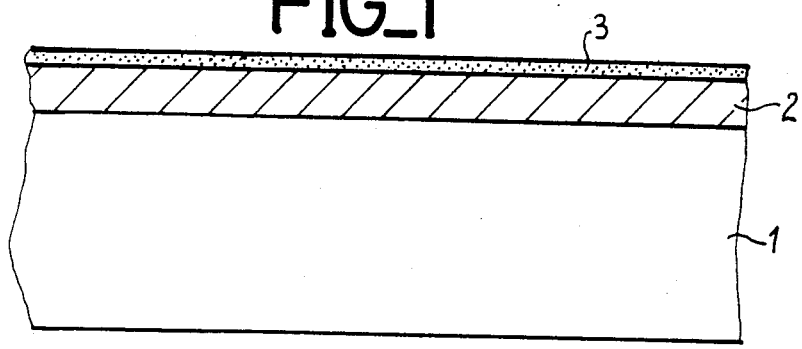
FIG_1
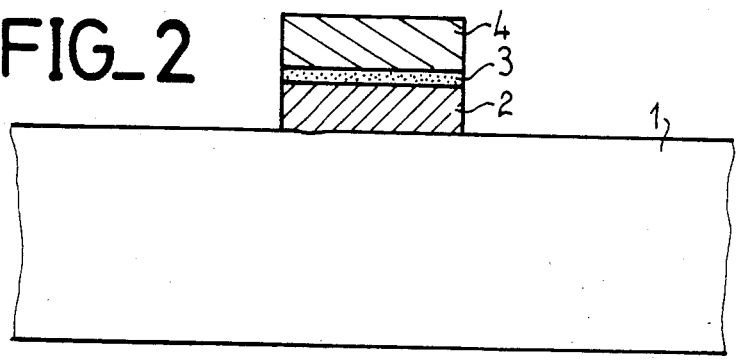
FIG_2
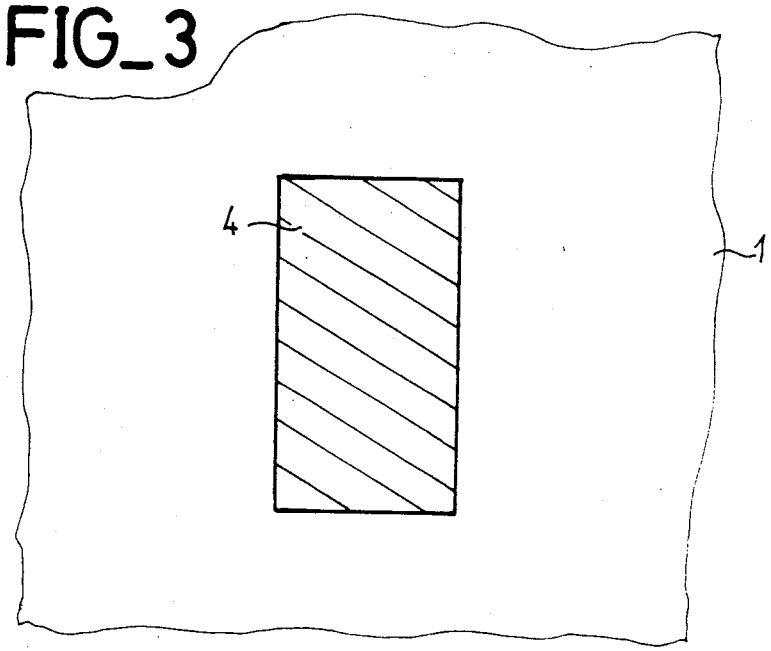
FIG_3

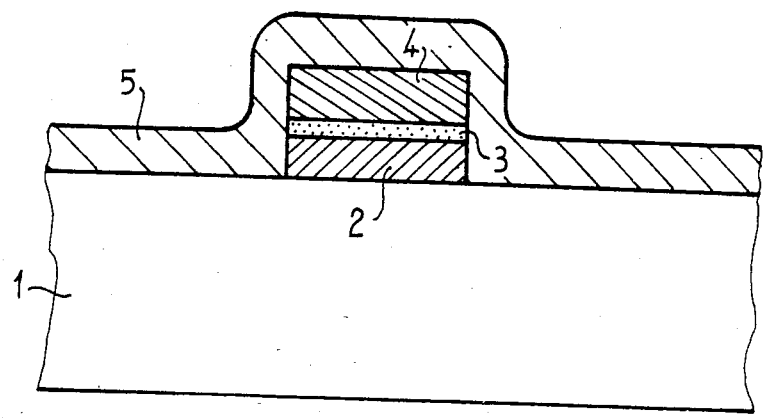
FIG_4
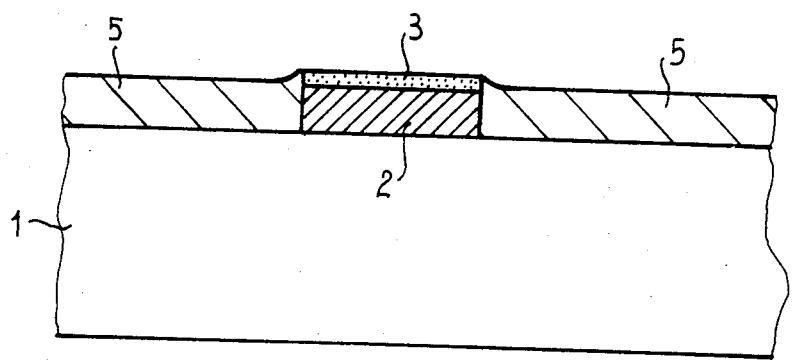
FIG_5

FIG_6
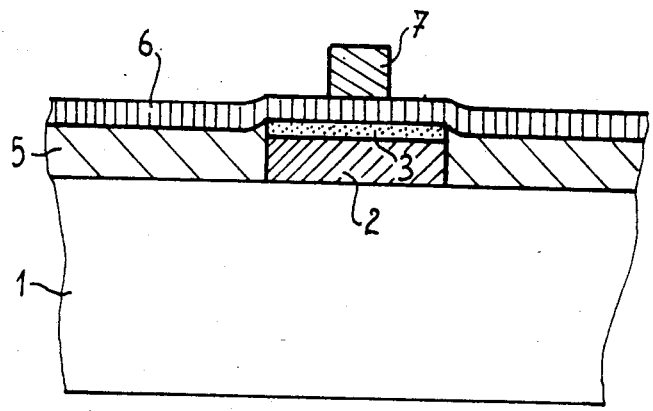
FIG_7
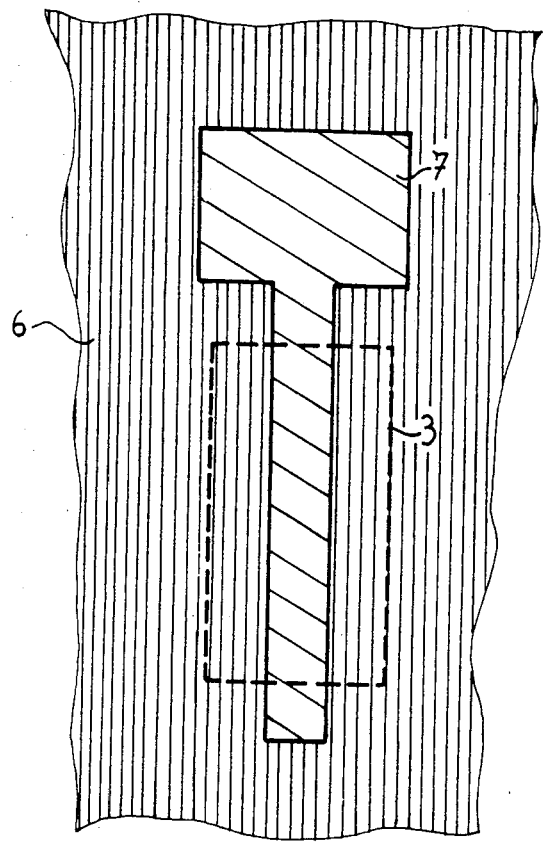

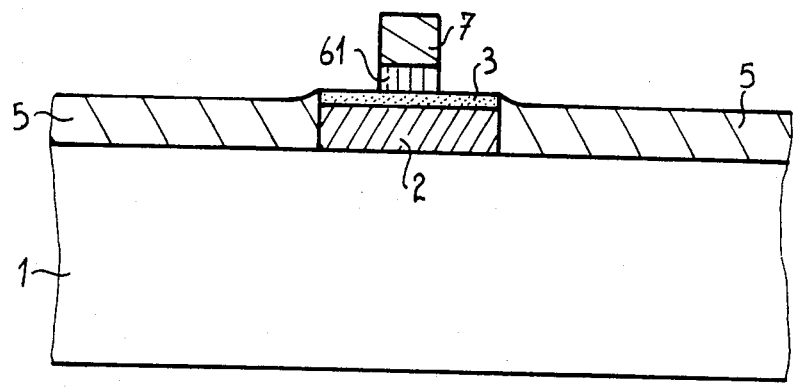
FIG_8
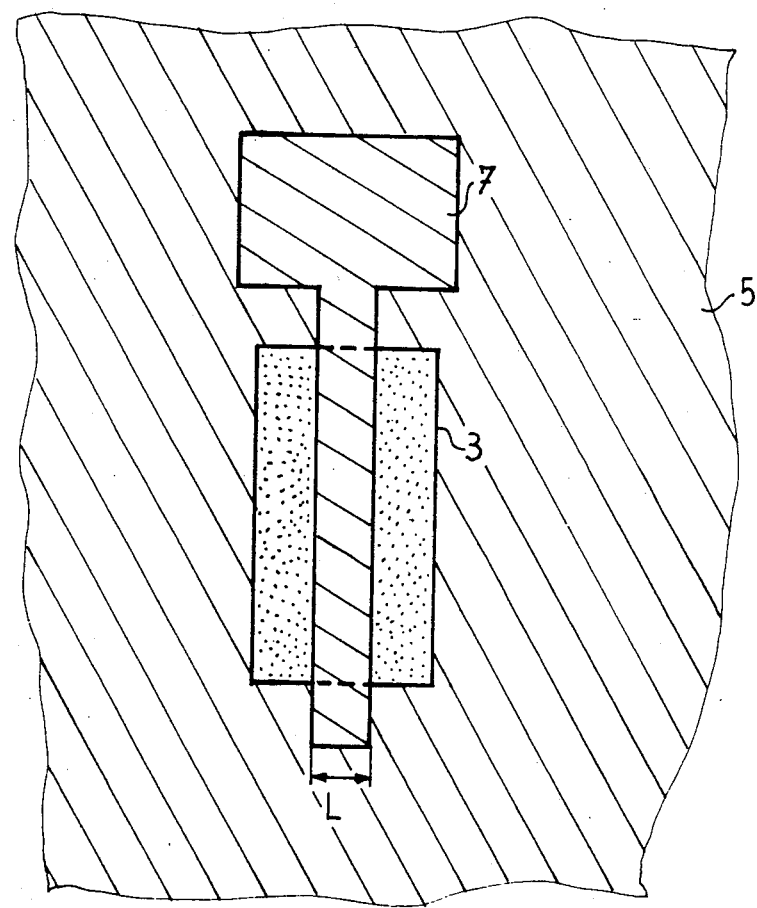
FIG_9

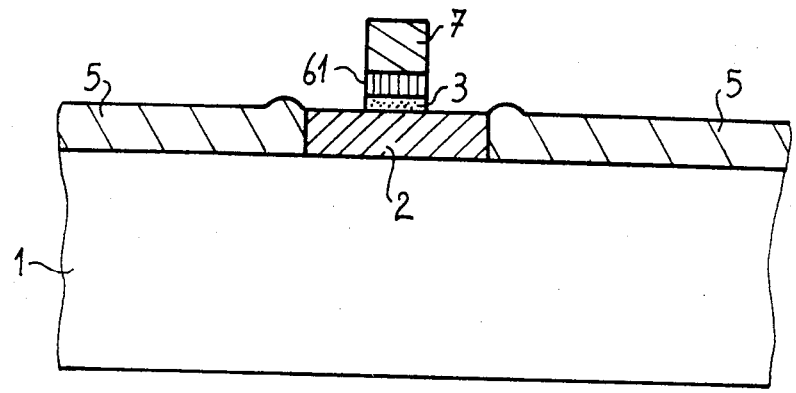
FIG_10
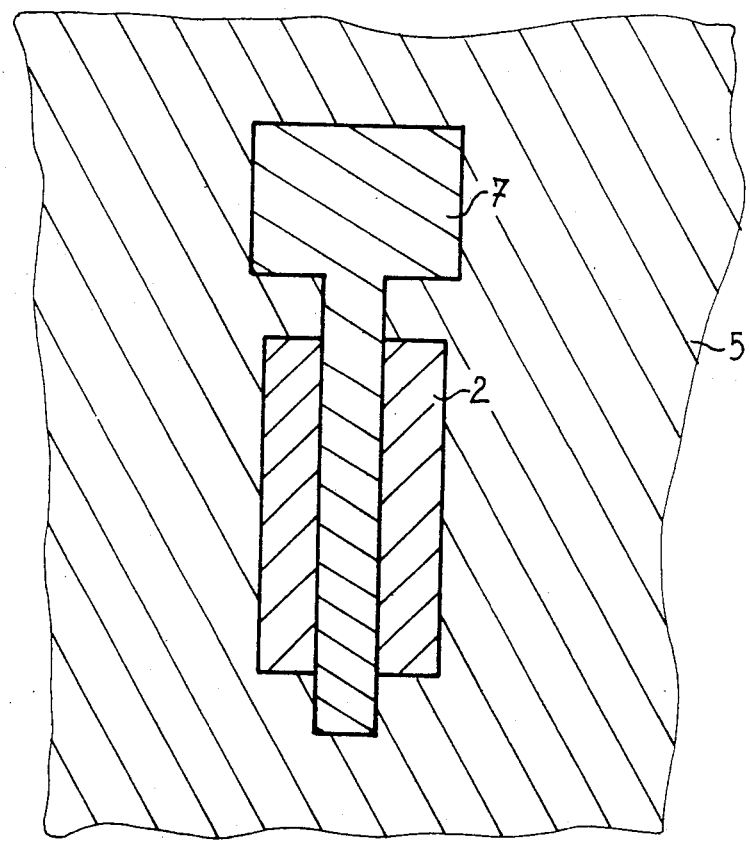
FIG_11

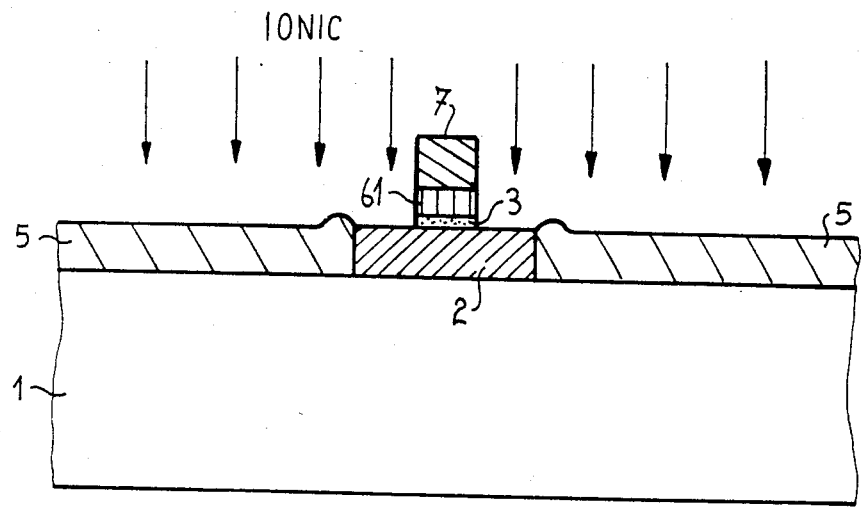
FIG_12
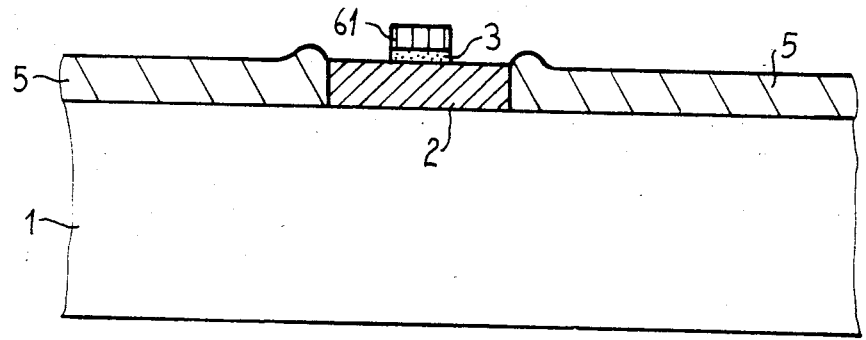
FIG_13
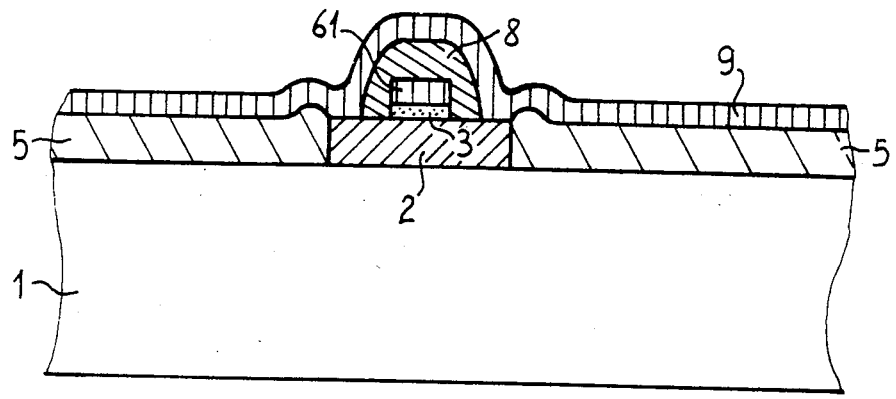
FIG_14

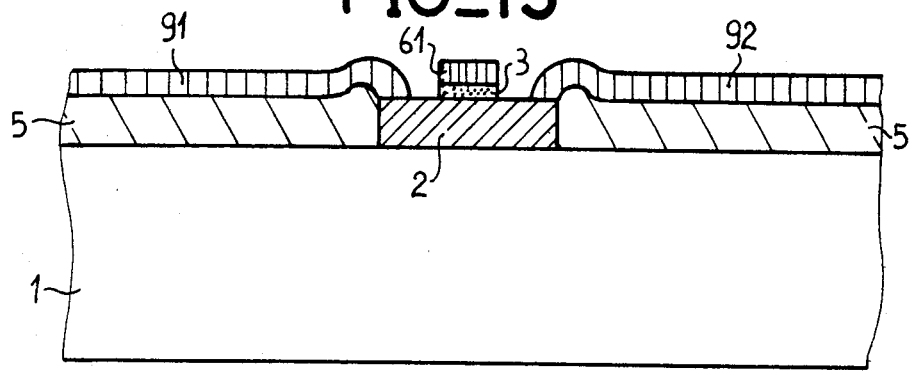
FIG_15
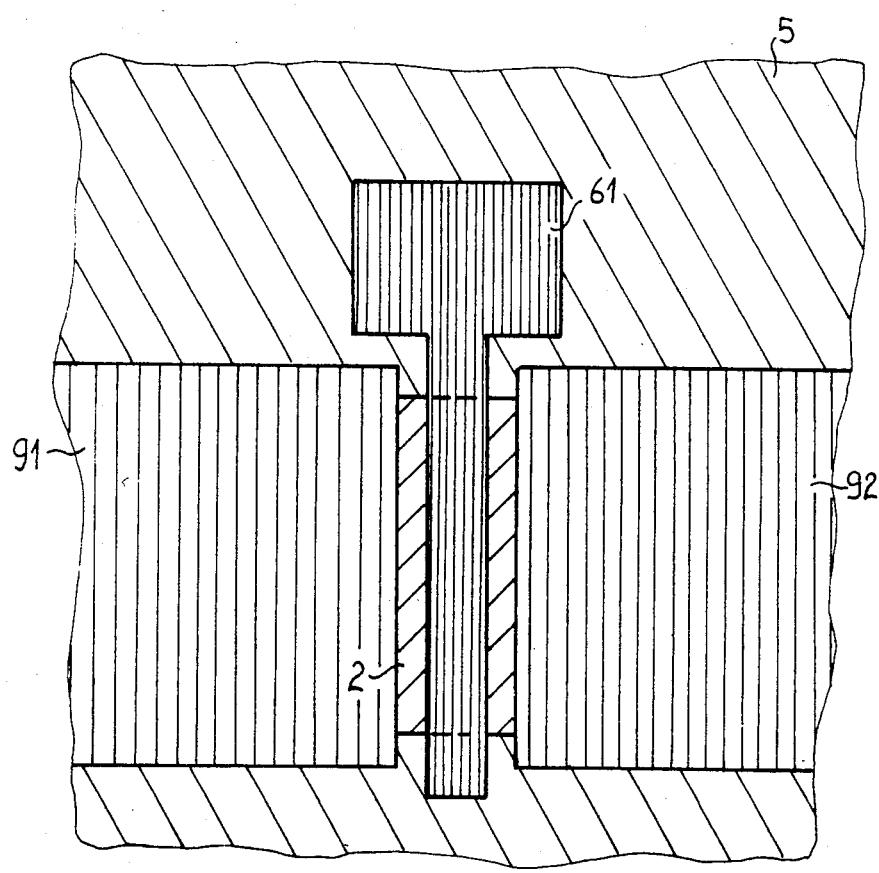
FIG_16

METHOD OF MAKING THIN FILM FIELD EFFECT TRANSISTORS FOR A LIQUID CRYSTAL DISPLAY DEVICE

BACKGROUND OF THE INVENTION

The present invention relates to a method for the manufacture of a coplanar, self-aligned field effect transistor. The method involves three masking levels and uses a thin film semiconductor. It is applicable to the field of large surface or area microelectronics and in particular to the control and addressing of a liquid crystal flat screen or an image sensor.

At present, the thin film semiconductor best suited to large surface or area devices is hydrogenated amorphous silicon. This is due to the low semiconductor deposition temperature, which makes it possible to use economic, transparent substrates, such as glass, as well as to the homogeneity of the deposited coating, even over large surfaces. However, the use of this material imposes four main constraints, which must be respected in order to obtain devices with optimum performance levels.

The first constraint is that the semiconductor and gate insulant coatings must be deposited consecutively and in the same enclosure, in order to maintain a good semiconductor - insulant interface quality. In the case of hydrogenated amorphous silicon (a-Si:H), this is generally respected because the devices used for depositing a-Si:H also make it possible to deposit the gate insulant without impairing the cleanness of the first deposit.

The second manufacturing constraint is the need to have good source and drain contacts, so that it is necessary to use a hydrogenated amorphous silicon coating highly doped in contact with the source and drain electrodes. Good quality source and drain contacts can be obtained by means of an intermediate a-Si:H coating doped during the deposit by adding a supplementary gas containing a doping element or by means of ion implantation.

The third manufacturing constraint is that as a result of the low conductivity of hydrogenated amorphous silicon, the distances between the channel and the source contact on the one hand and the drain contact on the other must be minimal. The source and drain contacts, as well as the gate must be defined in a precise manner (self-alignment of the electrodes), in order to reduce the stray capacitances occurring through the gate insulant. The source and drain contacts, as well as the gate must be located on the same side of the semiconductor coating, in order to eliminate the access resistance through the thickness of said coating. In most presently produced thin film transistors, the gate and the source and drain contacts partly overlap and are positioned on either side of the a-Si:H coating. A self-alignment method has recently been developed making it possible to produce thin film transistors with a staggered configuration, i.e. having the succession: substrate - gate - semiconductor insulant - drain and source contacts. This method is described in an article entitled "A self-alignment processed a-Si TFT matrix circuit for LCD panels" by ASMA et al in the Journal SID 83 Digest, pp. 144 and 145. The cutting of source and drain contacts in the n doped a-Si:H coating is carried out by irradiation from the substrate, which makes it possible for the gate to serve as a mask. This procedure is only applicable to the type of structure in which the gate and contacts are on either side of the a-Si:H coating, which must be sufficiently thin to be transparent.

The fourth manufacturing constraint is constituted by the number of masking levels. Four masking levels are generally used for the manufacture of a-Si:H thin film transistors, whereas three levels are sufficient in the self-aligned method. In order to increase the manufacturing efficiency and reduce its costs, it is necessary to limit the number of masking levels to the strict minimum. Hitherto, none of the known methods make it possible to satisfy the four aforementioned constraints. The manufacturing method according to the invention satisfies these constraints by self-alignment and ion implantation techniques. It makes it possible to reduce the number of masking levels to three.

BRIEF SUMMARY OF THE INVENTION

The present invention therefore relates to a method for the manufacture of at least one thin film field effect transistor of the coplanar type and with self-alignment of the electrodes, wherein the method comprises the eight following stages:

first stage: successive deposition on a substrate of a semiconductor coating and a gate insulant coating, second stage: formation of mesas by a first set of resin masks and by etching the semiconductor and gate insulant coatings down to the level of the substrate, each of the mesas serving to form a transistor, third stage: deposition of a passivation insulant coating and exposing the gate insulant by removing the resin, fourth stage: deposition of the gate electrodes of transistors by a second set of resin masks and photolithography, fifth stage: etching the gate insulant coating not covered by the gate electrodes until the semiconductor coating is exposed, sixth stage: obtaining ohmic source and drain contacts by ion implantation, seventh stage: elimination of the gate protection resin, followed by activation of the ions implanted in the preceding stage, eighth stage: deposition of source and drain electrodes by a third set of resin masks and removal of the resin.

The invention also relates to a thin film field effect transistor of the coplanar type with self-aligned electrodes produced on an insulating substrate, wherein it is obtained by the aforementioned manufacturing method.

BRIEF DESCRIPTION OF THE DRAWINGS

The invention is described in greater detail hereinafter relative to non-limitative embodiments and the attached drawings, wherein show:

FIG. 1, the first stage of the method according to the invention.
FIGS. 2 and 3, the second stage of the method.
FIGS. 4 and 5, the third stage of the method.
FIGS. 6 and 9, the fourth stage of the method.
FIGS. 10 and 11, the fifth stage of the method.
FIG. 12, the sixth stage of the method.
FIG. 13, the seventh stage of the method.
FIGS. 14 to 16, the eighth stage of the method.

DETAILED DESCRIPTION OF THE PREFERRED EMBODIMENTS

In an exemplified manner, the description relates to a method for the manufacture of thin film transistors (TFT) of a-Si:H on a substrate forming part of a liquid crystal display screen. These transistors are then intended for the addressing and integrated control of large surface devices. The method according to the invention is also applicable to other amorphous or polycrystalline semiconductors deposited in thin film form. The method according to the invention is a collective manufacturing method. For simplification reasons, the drawings only illustrate the manufacture of one transistor.

FIG. 1 illustrates the first stage of the manufacturing method according to the invention. This stage comprises depositing on a transparent substrate 1, a coating 2 of hydrogenated amorphous silicon a-Si:H, followed by an insulating coating 3. If the substrate is of glass, the deposition processes must be carried out at a temperature not deteriorating the properties thereof. In the case of the semiconductor, a deposition temperature of approximately 200° to 300° C. can be obtained by a luminous discharge gaseous phase deposition method. Hydrogenation results from an incorporation during the deposition according to a known method. The insulating coating 3 is deposited on coating 2 by the same gaseous plasma decomposition process, whose nature is dependent on the insulating type which it is wished to obtain. For example, if insulant 3 is of silicon nitride $Si_3N_4$, a mixture of silane $SiH_4$ and ammonia gas $NH_3$ is decomposed. Insulants such as silicon dioxide $SiO_2$ and silicon oxynitride SiON may also be suitable. The deposition temperature for coating 3 must not exceed the deposition temperature of the a-Si:H coating, so that the hydrogen does not escape through said coating. Typically, the thicknesses of the deposits are approximately 0.2 to 0.5 μm for the a-Si:H coating 2 and 0.1 to 0.2 μm for the insulating coating.

FIGS. 2 and 3 illustrate the second stage of the method. FIG. 2 is a front view corresponding to FIG. 1, and FIG. 3. is a plan view. This second stage is constituted by the first masking level used for delimiting the mesas on which the transistors will be produced. This involves the known procedure of protecting by means of a resin coating 4 those parts which are to be retained (one mesa per future transistor) and etching the part to be eliminated either chemically or by a dry process (plasma). Thus, the three coatings, semiconductor 2 - insulant 3 - resin 4 are superimposed on substrate 1. The dimensions of the mesas will depend on the intensity of the current to be withstood by each transistor. A possible order of magnitude for the type of use proposed is approximately 30 μm on 100 μm.

FIGS. 4 and 5 illustrate the third stage of the method consisting of depositing an insulant for passivating the sides of the mesa, in order to prevent short-circuits between the source or drain on the one hand and the gate on the other. As shown in FIG. 4, an insulating coating 5 is deposited by one of the aforementioned deposition methods. The insulant can be of silicon dioxide $SiO_2$, silicon nitride $Si_3N_4$ or any other insulant. The passivation insulating coating can have a thickness of 0.5 μm. Using the lift-off method, the resin elements 4 remaining from the second stage are eliminated, which has the effect of making the gate insulant deposited during the first stage reappear, as indicated in FIG. 5.

The fourth stage consists of depositing the gate metal, generally aluminum and carrying out conventional photolithographic cutting of the metal gate which constitutes the second masking level. FIGS. 6 and 7, which are front and plan views, show the metal coating 6 with a thickness of approximately 0.2 μm deposited by evaporation. It is also possible to see a resin mask 7 deposited on metal coating 6. This mask will define the transistor gate electrodes 61. This has, e.g., the shape of a T, whereof the width L (approximately 2 to 10 μm) of the vertical part will determine the length of the transistor channel and whereof the horizontal bar will act as a socket. FIGS. 8 and 9, which are also front and plan views, illustrate the device obtained at the end of the fourth stage of the method, where the gate electrode 61 is covered by mask 7, which was used for delimiting the same.

The fifth stage consists of etching, either chemically or by a dry method, the gate insulant not located directly beneath the gate electrode 61, so as to expose the lateral a-Si:H regions, on which the source and drain contacts will be formed. In this stage, all or part of the passivation insulant 5 not protected by the assembly formed by gate electrode 61 and resin 7 can be eliminated, the insulation sought on the sides of the mesa where the gate electrode projects not being impaired by said etching. As a result of the thickness difference between insulant coatings 3 and 5, the second being approximately five times thicker than the first, it is possible to maintain a given passivation insulant thickness. At the end of this stage, the device obtained is in the form shown in FIGS. 10 and 11, which are respectively a front and plan view.

The sixth stage of the method consists of obtaining ohmic source and drain contacts on the exposed semiconductor coating. Use is made of ion implantation at ambient temperature and FIG. 12 illustrates this stage of the method. For example, the implanted ions are phosphorus or arsenic for obtaining type n contacts and boron to obtain type P contacts. The self-alignment is obtained by the gate electrode, which is itself covered with resin. This resin coating constitutes a supplementary protection to prevent the penetration of implants into the gate insulant. Typically, the implanted ion doses are a few $10^{16}/cm^2$ for an energy between 50 and 250 keV, as a function of the semiconductor coating thickness and in the case of a n contact. It is appropriate to carry out implantation at different energy levels, in order to optimize the distribution of the ions implanted as a function of the performance levels required of the transistors.

The seventh stage of the method consists of eliminating the resin protecting the gate electrode and then activating the implants. The resin is eliminated chemically or by a dry method. The implants are activated by annealing under a neutral gas flow at a temperature of approximately 200° to 300° C., i.e. compatible with the non-exodiffusion of hydrogen from the a-Si:H coating. The advantage of this method is that of preventing the formation of an access resistance of the transistor channel. This stage is illustrated in FIG. 13, which shows the device obtained after the elimination of the resin and the activation of the implants. It is also possible to carry out the sixth stage at a temperature between 200° and 300° C. and consequently activate the impurities as soon as they are implanted. In this case, the seventh stage consists of removing the resin from the gate. Plasma etching will be necessary, because the resin will have been annealed.

The eighth and final stage consists of producing the metal source and drain contacts on the doped semiconductor. This is obtained by a third masking level and by the lift-off method. The metal contacts are generally of aluminum and are deposited by evaporation. They can also be produced from chromium or a nickel-chromium alloy. In such a production process, the length of the channel is defined by the gate and the width by the mesa, so that the positioning of the source and drain is not critical with respect to the gate and mesa. The sensitive point is to prevent a short-circuit, which could take place between the gate electrode and the source and drain electrodes. It is therefore possible to retain a given safety margin between the contacts and this is typically 5 to 10 μm. This distance is compatible with an extension of the process for the production of large surfaces, e.g. 20 cm to 20 cm. FIGS. 14, 15 and 16 illustrate this final stage of the method. Using known masking procedures, resin elements 8 are deposited on each future transistor. Each resin element 8 covers all the parts which are not to be metallized and particularly the gate electrode 61, the underlying gate insulant coating 3 and the doped semiconductor parts which are not to be metallized. The thickness of metal coating 9 is substantially equal to 0.2 μm. FIGS. 15 and 16 are a front and plan view of the final structure obtained. The resin lift-off operation makes it possible to give the transistor its final structure, by defining the source and drain electrodes 91, 92 respectively.

It is pointed out that the manufacturing method according to the invention leads to a structure having a channel, whose length is determined by the gate and whose width is determined by the mesa.

In the scope of the manufacture of a matrix access display screen, the metal coating 9 can, apart from forming the source and drain electrodes of each transistor, also be used for forming conductive access strips either to the source electrodes, or to the drain electrodes. This screen can be used in transmission, because the substrate is transparent and the passivation insulant largely covering the same is also transparent as a result of its optical properties and its limited thickness.

What is claimed is:

1. A method for the manufacture of at least one coplanar thin film field effect transistor with self-alignment of the electrodes, wherein the method comprises the eight following successive stages:
    first stage: successively depositing on a substrate a semiconductor coating and a gate insulant coating,
    second stage: defining mesas by a first set of resin masks and etching the resulting exposed semiconductor and gate insulant coatings down to the level of the substrate, to form mesas on the substrate, each of the mesas serving to form a transistor,
    third stage: depositing a passivation insulant coating on the substrate and the resin masks and exposing the gate insulant by removing the passivation insulant down to the level of the gate insulant and removing the resin mask,
    fourth stage: depositing an electrode layer on the passivation and gate insulant layers and forming gate electrodes by depositing a second set of resin masks over a portion of the gate insulant and removing the remaining electrode layer,
    fifth stage: etching the gate insulant coating not covered by the gate electrodes until the semiconductor coating is exposed,
    sixth stage: forming source and drain regions by ion implantation,
    seventh stage: eliminating the second resin masks, followed by activation of the ions implanted in the preceding stage,
    eighth stage: forming a third set of resin masks over the gate electrode and depositing source and drain electrode layers on the structure obtained in the previous stage and removing the third resin and the electrode layer thereon to form source and drain electrodes.

2. A manufacturing method according to claim 1, wherein, during the first stage, the semiconductor and gate insulant coatings are deposited in the same deposition device and by the same method.

3. A manufacturing method according to claim 2, wherein said deposition method is a luminous discharge gaseous phase deposition method.

4. A manufacturing method according to claim 1, wherein the semiconductor coating is a hydrogenated amorphous silicon coating.

5. A manufacturing method according to claim 1, wherein the gate insulant is selected from the group consisting of silicon dioxide, silicon nitride and silicon oxynitride.

6. A manufacturing method according to claim 1, wherein the source and drain regions are of type n and the implanted ions are phosphorus and arsenic.

7. A manufacturing method according to claim 1, wherein the source and drain regions are of type P and the implanted ions being of boron.

8. A manufacturing method according to claim 1, wherein the ion implantation of the sixth stage is carried out at different energy levels, in order to optimize the distribution of the implanted ions.

9. A manufacturing method according to claim 1, wherein the gate, source and drain electrodes are metals selected from the group consisting of aluminum, chromium and a nickel-chromium alloy.

10. A manufacturing method according to claim 1, wherein the gate, source and drain electrodes are deposited by evaporation.

11. A manufacturing method according to claim 1, wherein the implanted ions are activated by annealing under a neutral gas flux.

12. A method for the manufacture of at least one coplanar thin film field effect transistor with self-alignment of the electrodes, wherein the method comprises the eight following successive stages:
    first stage: successively depositing on a substrate a semiconductor coating at a temperature which does not deteriorate the substrate and a gate insulant coating at a temperature that does not exceed the deposition temperature of said semiconductor coating,
    second stage: defining mesas by a first set of resin masks and etching the resulting exposed semiconductor and gate insulant coatings down to the level of the substrate, to form mesas on the substrate, each of the mesas serving to form a transistor,
    third stage: depositing a passivation insulant coating on the substrate and the resin masks and exposing the gate insulant by removing the passivation insulant down to the level of the gate insulant and removing the resin masks,
    fourth stage: depositing an electrode layer on the passivation and gate insulant layers and forming gate electrodes by depositing a second set of resin masks over a portion of the gate insulant and removing the remaining electrode layer,
    fifth stage: etching the gate insulant coating not covered by the gate electrodes until the semiconductor coating is exposed, sixth stage: forming source and drain regions by ion implantation, seventh stage: eliminating the second resin masks, followed by activation of the ions implanted in the preceding stage, eighth stage: forming a third set of resin masks over the gate electrode and depositing source and drain electrode layers on the structure obtained in the previous stage and removing the third resin and the electrode layer thereon to form source and drain electrodes.

13. A manufacturing method according to claim 12, wherein the deposition of the semiconductor coating is a luminous discharge gaseous phase deposition at a temperature of approximately 200° to 300° C.

14. A manufacturing method according to claim 12, wherein the deposition of the gate insulant coating is a gaseous plasma decomposition process.

* * * * *